United States Patent
Thakur et al.

[11] Patent Number: 5,913,149
[45] Date of Patent: *Jun. 15, 1999

[54] METHOD FOR FABRICATING STACKED LAYER SILICON NITRIDE FOR LOW LEAKAGE AND HIGH CAPACITANCE

[75] Inventors: Randhir P. S. Thakur; Gurtej Singh Sandhu, both of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/312,744

[22] Filed: Sep. 14, 1994

Related U.S. Application Data

[63] Continuation-in-part of application No. 07/999,335, Dec. 31, 1992, Pat. No. 5,376,593.

[51] Int. Cl.⁶ .................................................. H01L 21/318
[52] U.S. Cl. .......................... 438/762; 438/791; 438/775; 438/776
[58] Field of Search .................................... 437/241, 242, 437/235, 238, 239; 134/1.1, 1.2, 1.3, 3, 31; 216/74, 66; 438/791, 787, 792, 771, 775, 770, 776, 788, 906, 706, 707, 708, 762; 156/643.1, 646.1

[56] References Cited

U.S. PATENT DOCUMENTS

| | | | |
|---|---|---|---|
| 4,277,320 | 7/1981 | Beguwala et al. | 204/164 |
| 4,435,447 | 3/1984 | Ito et al. | 427/94 |
| 4,715,937 | 12/1987 | Moslehi et al. | 204/177 |
| 4,855,258 | 8/1989 | Allman et al. | 437/241 |
| 4,996,081 | 2/1991 | Ellul et al. | 427/96 |
| 5,032,545 | 7/1991 | Doan et al. | 437/242 |
| 5,067,218 | 11/1991 | Williams | 29/25.01 |
| 5,100,495 | 3/1992 | Ohmi et al. | 156/646.1 |
| 5,173,152 | 12/1992 | Tanaka | 156/646 |
| 5,178,682 | 1/1993 | Tsukamoto et al. | 118/722 |
| 5,208,189 | 5/1993 | Nguyen et al. | 437/238 |
| 5,238,500 | 8/1993 | Bergman | 134/3 |
| 5,248,380 | 9/1993 | Tanaka | 156/646.1 |
| 5,250,452 | 10/1993 | Ozturk et al. | 437/41 |
| 5,264,396 | 11/1993 | Thakur et al. | 437/238 |
| 5,294,568 | 3/1994 | McNeilly et al. | 437/235 |
| 5,330,935 | 7/1994 | Dobuzinsky et al. | 437/239 |
| 5,332,697 | 7/1994 | Smith et al. | 437/242 |
| 5,376,593 | 12/1994 | Sandhu et al. | 437/242 |
| 5,380,399 | 1/1995 | Miyashita et al. | 156/646 |
| 5,422,291 | 6/1995 | Clementi et al. | 437/43 |
| 5,423,944 | 6/1995 | Wong | 156/646.1 |
| 5,443,863 | 8/1995 | Neely et al. | 437/239 |
| 5,445,999 | 8/1995 | Thakur et al. | 437/242 |
| 5,451,425 | 9/1995 | Vig | 427/8 |
| 5,503,708 | 4/1996 | Koizumi et al. | 156/643.1 |
| 5,547,642 | 8/1996 | Seiwa et al. | 422/186.3 |

FOREIGN PATENT DOCUMENTS

| | | | |
|---|---|---|---|
| 1252372 | 4/1989 | Canada | H01L 21/318 |
| 58-017677 | 2/1983 | Japan | H01L 29/78 |
| 62-149139 | 3/1987 | Japan | H01L 21/316 |

OTHER PUBLICATIONS

Mehrdad M. Moslehi, "Thermal Nitridation of Si and SiO2 for VLSI", *IEEE Transaction On Electrical Devices*, vol. ED–32. No. 2, Feb. 1985, pp. 106–123.

Stanley Wolf Ph.D, "Silicon Processing For The VLSI Era", vol. 1, *Lattice Press*, pp. 156–157.

*Primary Examiner*—Charles Bowers
*Assistant Examiner*—Matthew Whipple
*Attorney, Agent, or Firm*—W. Eric Webostad

[57] ABSTRACT

A method is provided for forming silicon nitride stacks. A semiconductor substrate is cleaned to remove any native oxide, and an insulative material is disposed thereon. A plurality of films are deposited superjacent the insulative material, and each of the plurality of films converted into a dielectric to form a multi-layered stack. A fill layer is formed superjacent the multi-layered stack to seal any pinholes. The fill layer is formed by at least one of low temperature chemical vapor deposition (CVD) of oxide, low temperature deposition of nitride, low temperature re-oxidation of ozone, the low temperature is at least 20° C.

4 Claims, 3 Drawing Sheets

METHOD FOR FABRICATING STACKED LAYER SILICON NITRIDE FOR LOW LEAKAGE AND HIGH CAPACITANCE

CROSS REFERENCE TO RELATED APPLICATION

This is a continuation application to U.S. Pat. No. 5,376,593 filed as U.S. patent application Ser. No. 07/999,335, on Dec. 31, 1992.

FIELD OF THE INVENTION

This invention relates to semiconductor processes and to a method for fabricating a stacked layer of $Si_3N_4$. More particularly, the invention relates to a process for formulating a thin dielectric layer having low leakage and high capacitance characteristics.

BACKGROUND OF THE INVENTION

As the trend of scaling down integrated circuits continues, the semiconductor industry is forced to consider new techniques for fabricating precise components at submicron levels. This is of particular relevance to the manufacture of memory devices. The expansion of the memory capacity is dependent on the ability to fabricate smaller cells having increased capacitances. Dielectric layers are the foundation to the creation of cell capacitors. As such, if a thinner a dielectric layer is manufactured which has the necessary dielectric constant, the smaller the memory cell.

In metal oxide semiconductor ("MOS") technology, small, high performance transistors require thin gate and cell dielectrics. An ultrathin ($\leq 100$ Å) dielectric layer should minimally comprise enhanced dielectric properties.

However, several additional design considerations must be examined in the manufacture of ultrathin dielectric layers. These include uniformity in thickness, reliability, high dielectric constant, as well as imperviousness to electrical and thermal breakdown. Ultimately, high performance, ultrathin dielectric layers should also comprise a low diffusion rate for impurities, low interface state density, and chemical stability. Nevertheless, the physical constraints of the materials and methods of fabrication employed have made the characteristics of the dielectrics less than the optimum.

Silicon dioxide, at thicknesses greater than 100 Å, provides a cost effective, high quality dielectric layer for single crystal silicon, polycrystalline silicon ("polysilicon"), or amorphous silicon substrates. Nonetheless, for dielectric layers less than 100 Å, silicon dioxide is known to have a high defect density. Silicon dioxide also exhibits poor characteristics as a diffusion mask against impurities. Further, silicon dioxide has a relatively low dielectric constant.

In light the inherent limitations of silicon dioxide for dielectric layers of 100 Å or less, several alternatives have been developed. One such alternative is the use of silicon nitride ($Si_3N_4$) as a dielectric layer. This layer can be formed on a substrate surface through a process which includes Rapid Thermal Nitridation ("RTN"). Under RTN, the silicon substrate is exposed to either pure ammonia ($NH_3$) or an ammonia plasma at temperatures approximately between 850° C. and 1200° C. to form a silicon nitride film.

Precise ultrathin dielectric layers are currently fabricated employing RTN. However, these layers have several shortcomings. RTN-type ultrathin dielectrics lack uniformity in their overall composition. Further, they have questionable reliability in part because of their susceptibility to high electrical leakage, as well as electrical and thermal breakdown. Hence, the overall cell capacitance of the known art is limited.

Moreover, current techniques for fabricating ultrathin dielectric layers, such as silicon nitride, have failed to address current leakage caused by the bulk effects of semiconductor wafers, also known as, pinholes. This problem is of significance where the dielectric layer is substantially in the 100 Å range. A pinhole having a sufficient length enables current leakage, and as such, reduces the overall reliability of the device.

One solution to the problem of pinholes is to divide the dielectric layer having a specified thickness and dielectric constant into two comparable dielectric layers which have both a composite thickness and dielectric constant.

Referring to FIG. 1, a first dielectric layer 5 is illustrated superjacent a semiconductor substrate 1. First dielectric layer 5 comprises a pinhole 4. Superjacent first dielectric layer 5 is a second dielectric layer 9 comprising a pinhole 6. If both first and second dielectric layers, 5 and 9, are replaced with a single dielectric layer having an equivalent dielectric constant, a pinhole therein may be sufficient to cause electrical leakage.

However, by forming two independent dielectric layers, the probability is substantially reduced that both pinholes 4 and 6 are aligned in such a way as to create the potential for leakage.

SUMMARY OF THE INVENTION

The primary object of the present invention is to eliminate the aforementioned drawbacks of the prior art.

It is a further object of the present invention to provide a method of fabricating an ultrathin dielectric layer which isolates and overcomes the bulk effects of semiconductor wafers.

Another object of the present invention is to provide a method of fabricating an ultrathin dielectric layer having substantially reduced leakage current, and reduced overall thermal budget.

Yet another object of the present invention is to provide a method for fabricating a semiconductor wafer having reduced structural defects, and enhanced electrical properties.

A further object of the present invention is to provide a method of fabricating an ultrathin dielectric layer having reduced sensitivity towards pinholes.

Still another object of the present invention is to provide a method of fabricating an ultrathin dielectric layer having an increased overall electrical reliability.

Yet another object of the present invention is to provide a method of fabricating an ultrathin dielectric layer independent of process time.

In order to achieve the hereinabove objects, as well as others that will become apparent hereafter, a method for fabricating semiconductor wafers is disclosed wherein a rugged and/or smooth, atomically clean, semiconductor substrate is provided in a chamber. Subsequently, a first silicon nitride layer is formed in situ under high pressure superjacent the substrate by introducing a gas containing nitrogen, preferably $NH_3$ combined with $N_2$, at a temperature within the range of 850° C. to 1150° C. for approximately 10 to 60 seconds. This results in the first layer having a thickness of at least 5 Å.

A semiconductor film is then deposited in situ under high pressure superjacent the first silicon nitride layer, preferably by means of Rapid Thermal Processing Chemical Vapor Deposition ("RTPCVD"). In an alternate embodiment of the present invention, this is accomplished by either Low Pressure Chemical Vapor Deposition ("LPCVD") or Molecular Beam Epitaxy ("MBE"). The thickness of the film is at least 10 Å.

Consequently, the film is transformed in situ under high pressure into a second silicon nitride layer by introducing a gas containing nitrogen, preferably $NH_3$ combined with $N_2$, at a temperature substantially within the range of 850° C. to 1150° C. applied for approximately 10 to 60 seconds. The thickness of the second silicon nitride layer is substantially in the range of the thickness of the film.

In one embodiment of the present invention, only a portion of the film is transformed into a second silicon nitride layer, thereby creating a remainder of the film subjacent the second silicon nitride layer. In this embodiment, the thickness of the second silicon nitride layer is less than the thickness of the film.

Finally, a second semiconductor film is deposited superjacent the second layer in situ under high pressure.

In one alternate embodiment of the present invention, a pair of silicon dioxide layers are grown between the step of providing a semiconductor substrate and the step of depositing a second semiconductor film. It should be noted that the semiconductor substrate, the semiconductor film, and the second semiconductor film each comprise at least one of single-crystal silicon, polycrystalline silicon, and amorphous silicon.

Other objects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
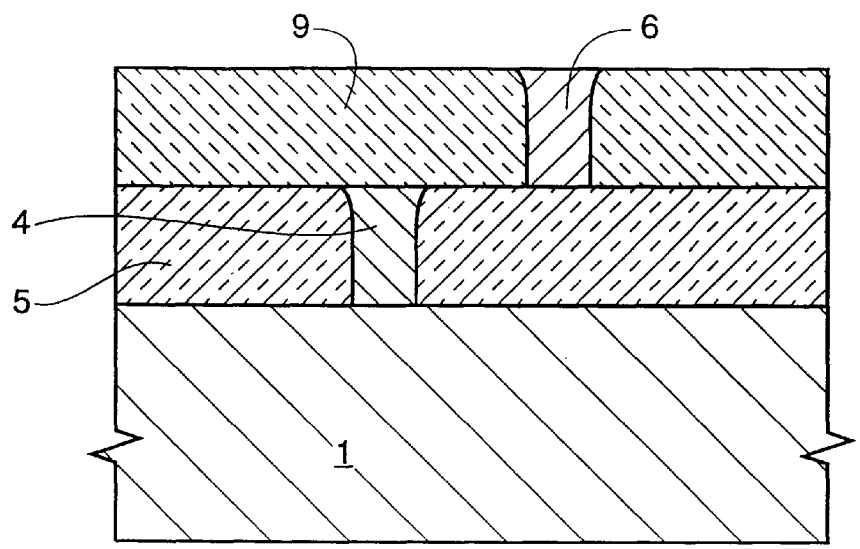
FIG. 1 is a cross-sectional view of a semiconductor substrate with pinholes.
Figure 2:
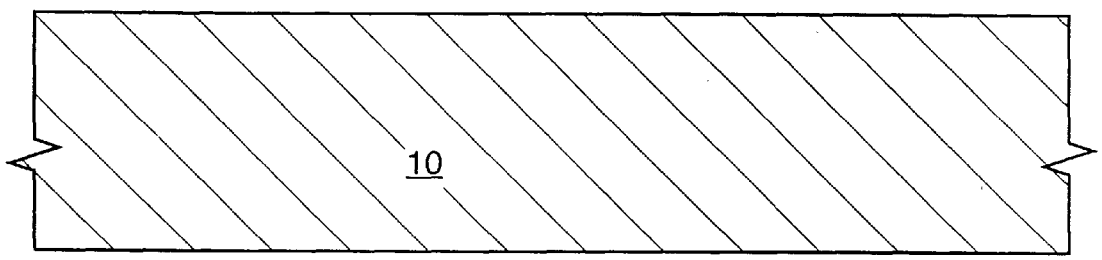
FIG. 2 is a cross-sectional view of a semiconductor substrate prior to undergoing the steps of the present invention.

Referring to FIG. 2, a semiconductor substrate 10 within a chamber 80 is illustrated prior to undergoing process of the present invention. Substrate 10 preferably comprises polycrystalline silicon ("polysilicon"), though single crystal silicon, amorphous silicon or any other suitable material known in art can also be employed. Further, substrate 10 can be rugged and/or smooth. Alternatively, the substrate can also be rippled or corrugated, in the case of cylindrical or contained capacitor structures.

Substrate 10 is atomically cleaned in the process of the present invention. The clean is necessary because a native silicon dioxide layer 70 easily forms superjacent substrate 10 by simple exposure to the atmosphere. Unfortunately, native silicon dioxide has inferior electrical and structural characteristics when compared with other dielectric type materials, such as grown silicon dioxide. As such, the overall electrical and structural characteristics of the completed wafer having native silicon dioxide are substantially impacted. Thus, in order to maintain the integrity of the wafer, any native silicon dioxide formed is removed by atomically cleaning substrate 10.

There are a variety of techniques for removing native oxide 25. Those known to one of ordinary skill in the art are not described. In one embodiment of the present invention, the substrate 10 is cleaned by radiating vapor phase ozone ($O_3$) with energy from an ultra-violet source. This reaction takes place at a room temperature, i.e. at least 20° C. This process effectively removes the native oxide layer in just a few seconds.

An alternative embodiment employs an in-situ vapor clean using a hydrogen halide, such as hydrofluoric acid (HF) and hydrochloric acid (HCl). This vapor clean is also performed at room temperature, although higher temperatures can also be used. This method also is effective to remove any native oxide in a few seconds. In an alternative embodiment, methanol is added to the hydrogen halide. The methanol is used as a dilutant. The above described techniques for native oxide removal are advantageous for sub-half micron densities, for which lower thermal budgets are critical.

Another alternative embodiment of the present invention, native silicon dioxide is removed by introducing a reactive gas, for example as $NF_3$, $GeH_4$, HF, or $H_2$ further diluted with an inert gas, such as Ar—$H_2$, and heat at a temperature substantially within the range of 850° C. to 1250° C. for approximately 10 to 60 seconds. Relying on this method, any native silicon dioxide formation between 10 Å and 20 Å is easily removed.

The process of the present invention involves providing an atomically cleaned substrate 10 into a chamber 88, before growing any further layers. To simplify the entire process, the chamber is preferably a Rapid Thermal Processing ("RTP") chamber. By employing an RTP chamber, substrate 10 is directly cleaned within the chamber. As such, the remaining steps of the present inventive method are preferably performed in situ, under high vacuum.

However, in an alternate embodiment of the present invention, the remaining steps are performed ex situ, on cluster tools. Employing such an approach, a load lock is created between each tool to avoid exposing the wafer during any part of the process to the atmosphere and contaminants.

The process of the present invention can also be performed using in situ cluster processing, in which the wafer is not exposed to the atmosphere during fabrication of the stacked dielectric layers.

Figure 3:
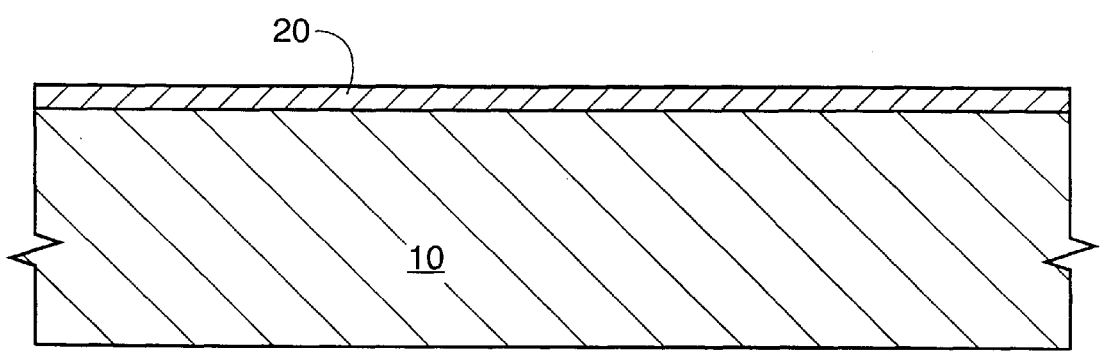
FIG. 3 is a cross-sectional view of the semiconductor substrate of FIG. 2, after an insulative material has been formed, according to the process of the present invention.

Referring to FIG. 3, a first dielectric layer 20 is illustrated superjacent atomically clean substrate 10. Upon providing clean substrate 10, first dielectric layer 20 is grown relying on the principles of Rapid Thermal Nitridation ("RTN").

Substrate 10 is exposed to a gas and heat at a temperature substantially within the range of 850° C. to 1150° C. for approximately 10 to 60 seconds. The gas to be introduced in the preferred embodiment of the present invention comprises nitrogen, such as $NH_3$ combined with $N_2$ for example. By employing a nitrogen based gas, first dielectric layer 20 forms comprising silicon nitride and having an approximate thickness in the range of 5 Å to 30 Å. This range is in part effected by the self limiting nature of silicon nitride grown by means of RTN. This is followed by the deposition of a first nitride layer using Chemical Vapor Deposition ("CVD"), Low Pressure Chemical Vapor Deposition ("LPCVD"), Molecular Beam Epitaxy ("MBE"), etc. First dielectric layer 20 is thus formed by RTN and deposition of a nitride film.

Subsequently, this film is re-oxidized using ozone gas at a temperature of at least 100° C. In another embodiment, following the formation of layer 20, a thin layer of amorphous silicon is deposited having a thickness of at least 20 Å. This amorphous silicon layer is then subjected to Rapid Thermal Nitridation ("RTN").

This sequence of forming multiple layers is continued until the desired thickness for the specific application is achieved. The stacked silicon nitride structures formed using this embodiment of the process of the present invention are fabricated in a single wafer RTCVD-type system that provides an easy switching of various gas chemistries without cross-contamination.

In another alternative embodiment, the stacked layer is re-oxidized using a wet oxidation with ultra-violet radiation to form layer 20. This re-oxidation method can also be performed at any of the interfaces of the multi-layer dielectric stack. The purpose is to fill any pinholes which have formed in the composite dielectric structure.

Figure 4:
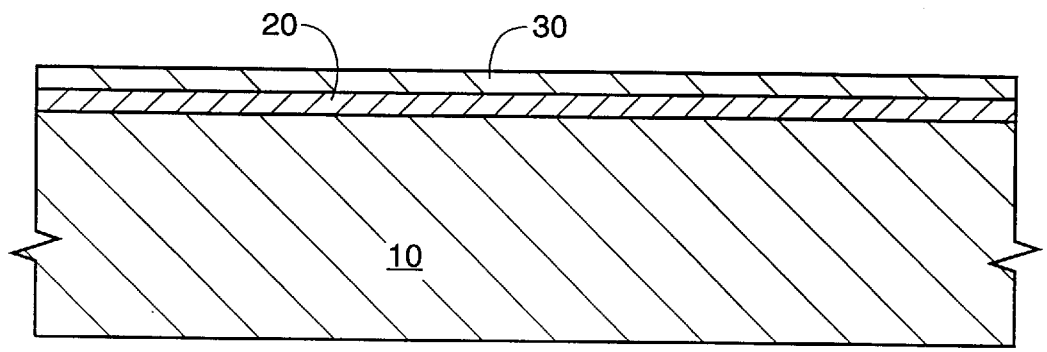
FIG. 4 is a cross-sectional view of the semiconductor substrate of FIG. 3, after a film has been formed superjacent the insulative material, according to the process of the present invention.

Referring to FIG. 4, a film 30 is deposited superjacent said first dielectric layer 20. Film 30 preferably comprises polycrystalline silicon ("polysilicon"), though single crystal silicon, amorphous silicon, or any other suitable material known in art can also be employed. Moreover, film 30 can be rugged and/or smooth, as well as rippled or corrugated. Preferably, film 30 has an approximate thickness in the range of 10 Å to 40 Å, though it can also be a monolayer.

There are a variety of known techniques for depositing film 30. As such, those known to one of ordinary skill in the art are not described. In the preferred embodiment of the present invention, film 30 is deposited in situ under high vacuum, superjacent first dielectric layer 20 by means of Rapid Thermal Processing Chemical Vapor Deposition ("RTPCVD").

In an alternate embodiment, the depositing is accomplished by either Low Pressure Chemical Vapor Deposition ("LPCVD") or Molecular Beam Epitaxy ("MBE"). Relying on RTPCVD principles, this step involves introducing film 30 at a temperature substantially within the range of 300° C. to 1000° C. for approximately 10 to 60 seconds.

Figure 5:
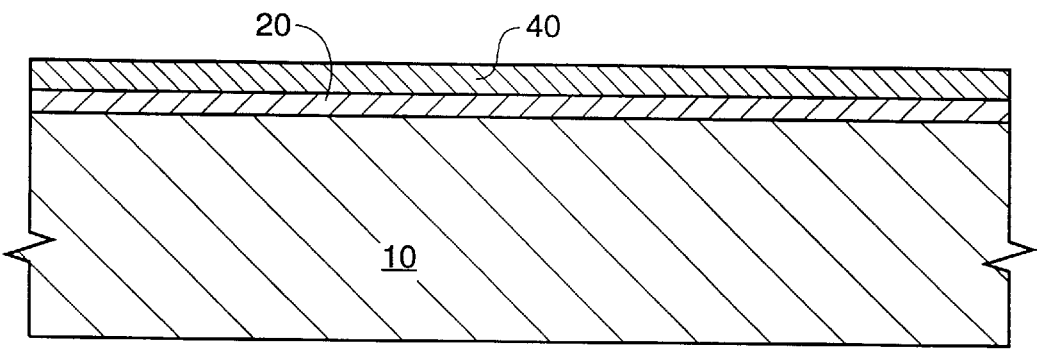
FIG. 5 is a cross-sectional view of the semiconductor substrate of FIG. 4, after the film has been converted to a dielectric, according to the process of the present invention.

Referring to FIG. 5, a second dielectric layer 40 is depicted superjacent first dielectric layer 20. Film 30 is transformed into second dielectric layer 40. This is accomplished by introducing gas and heat at a temperature substantially within the range of 850° C. to 1150° C. for approximately 10 to 60 seconds, preferably, in situ under high vacuum. The gas introduced in the preferred embodiment of the present invention comprises nitrogen, such as, $NH_3$ combined with $N_2$, for example. By employing a nitrogen based gas, second dielectric layer 40 forms comprising silicon nitride.

The relationship between the thickness of second dielectric layer 40 and film 30 is dependent on the complete interaction of film 30 with the nitrogen based gas introduced. As such, in the preferred embodiment of the present invention, the approximate thickness of second dielectric layer 40 is substantially in the range of the thickness of film 30.

Figure 7:
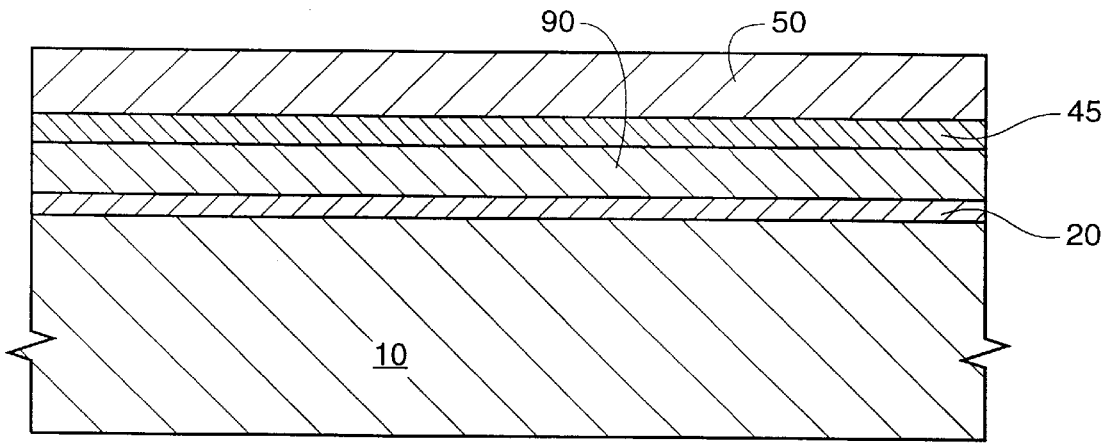
FIG. 7 is a cross-sectional view of the semiconductor substrate of FIG. 6, having a floating film disposed between the insulative material and the dielectric, according to one embodiment of the process of the present invention.

However, in an alternate embodiment, only a portion 45 of film 30 is converted to second dielectric layer 40, as shown in FIG. 7. In this scheme, a floating film remainder 90 is created subjacent portion 45 of film 30 which is converted to second dielectric layer 40. The floating film remainder 90, given the relatively high dielectric constant of silicon, polysilicon and amorphous silicon, provides a means for increasing the dielectric constant of the composite layer—first dielectric layer 20, second dielectric layer 40 and floating film remainder 90.

It should be obvious to one of ordinary skill in the art that floating film remainder 90, acting as a dielectric layer, has an optimum thickness for formulating a high capacitance value. As such, floating film remainder 90 should be substantially less than 100 Å.

Figure 6:
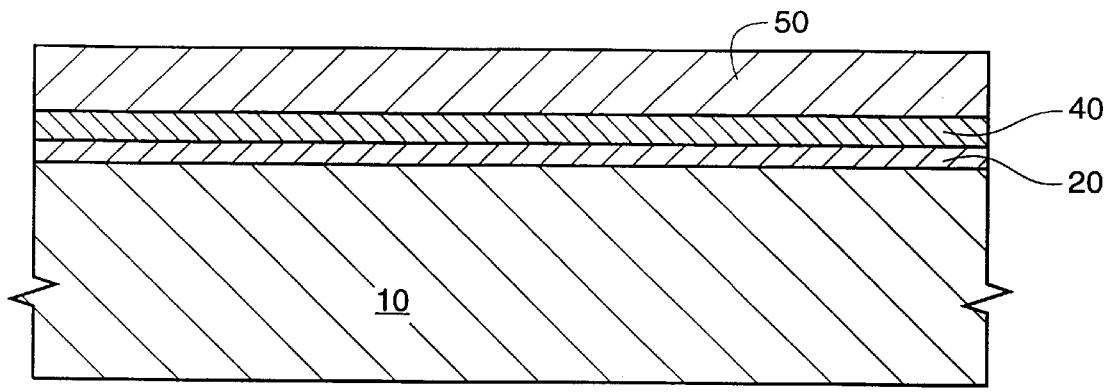
FIG. 6 is a cross-sectional view of the semiconductor substrate of FIG. 5, after a subsequent layer has been formed superjacent the dielectric, according to the process of the present invention.

Referring to FIG. 6, a coating 50 is shown superjacent second dielectric layer 40. Coating 50 preferably comprises polycrystalline silicon ("polysilicon"), though single crystal silicon, amorphous silicon, or any other suitable material known in art can also be employed. Further, coating 50 can be rugged and/or smooth, as well as rippled or corrugated.

The deposition of coating 50, given first and second dielectric layers, 20 and 40, and substrate 10, gives rise to a complex structure. This structure can be employed in the formation of cell capacitors and transistors.

Coating 50 acts as a "fill" for any pinholes which have formed during the above-described process. The presence of coating 50 prevents the pinholes from extending through the multi-stack structure.

There are a variety of known techniques for depositing coating 50 superjacent second dielectric layer 40. As such, those known to one of ordinary skill in the art are not described. One embodiment employs rapid thermal oxidation ("RTO"). Employing this scheme, silicon dioxide layer 50 is grown, preferably in situ under high vacuum, by introducing a gas containing oxygen, such as $O_2$ and $N_2O$, at a temperature between 850° C. and 1250° C. for approximately 5 seconds to 30 seconds.

Another alternative embodiment is to fill the pinholes with CVD oxide. This embodiment is performed at a lower temperature than either Rapid Thermal Nitridation ("RTN") or Rapid Thermal Oxidation ("RTO").

In another alternative embodiment of the present invention, coating 50 is provided superjacent second dielectric layer 40 in situ under high vacuum by means of Rapid Thermal Processing Chemical Vapor Deposition ("RTPCVD").

In another alternate embodiment, this step is accomplished by either LPCVD or MBE. Relying on RTPCVD principles, this step involves introducing coating 50 at a temperature substantially within the range of 300° C. to 1000° C. for approximately 10 to 60 seconds.

In another alternate embodiment of the present invention, additional silicon dioxide layers 100 and 100' are formed between coating 50 and substrate 10, preferably by means of Rapid Thermal Oxidation. Employing this scheme, silicon dioxide layers 100 and 100' are grown, preferably in situ under high vacuum, by introducing a gas containing oxygen, such as $O_2$ and $N_2O$, at a temperature between 850° C. and 1250° C. for approximately 5 seconds to 30 seconds.

The addition of silicon dioxide layers 100 and 100' provide a particular approach for improving the electrical leakage and reliability of the overall composite layer—first dielectric layer 20, second dielectric layer 40 and floating film remainder 90—given the inherent electrical properties of silicon dioxide.

Figure 8:
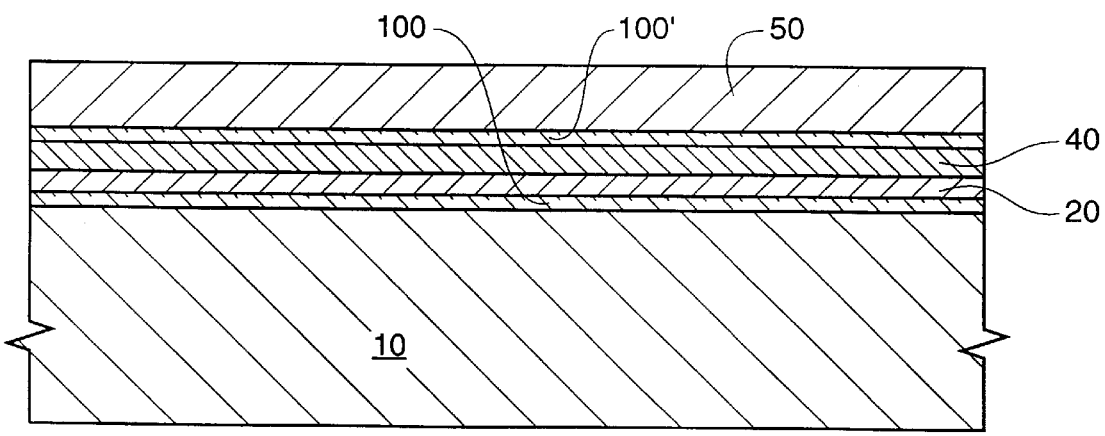
FIG. 8 is a cross-sectional view of the semiconductor substrate of FIG. 6, having silicon dioxide layers disposed between the substrate and the dielectric between the dielectric and the subsequent layer, according to a second embodiment of the process of the present invention.

It should be noted that while FIG. 8 illustrates silicon dioxide layer 100 subjacent first dielectric layer 20 and silicon dioxide layer 100' superjacent second dielectric layer 40, there are many alternate configurations that one of ordinary skill in the art could devise to promote the present invention.

While the particular process as herein shown and disclosed in detail is fully capable of obtaining its objects and advantages herein before stated, it is to be understood that it is merely illustrative of the presently preferred embodiments of the invention and that no limitations are intended to the details herein shown, other than as described in the appended claims.

The present invention is equally applicable to memory devices, such as flash memories, DRAMs, SRAMs, VRAMs, as well as other technologies requiring the dielectric layers. Moreover, the present invention is not limited to silicon, polysilicon and amorphous silicon. Materials such as SiGe and $GeO_2$ are applicable. The particular sensitivity of $GeO_2$ to water in the fabrication of semiconductor wafers is particularly overcome by the present inventive method.

Further, it is to be understood that although the present invention has been described in a preferred embodiment, various modifications known to those skilled in the art may be made without departing from the spirit of the invention, as recited in the claims appended hereto.

What is claimed is:

1. A method for fabricating muiti-layer dielectrics, the method comprising the steps of:

cleaning of a silicon substrate with a reactive gas at a temperature which is within a range of 850° C. to 1250° C. to remove native oxide from the silicon substrate, the reactive gas comprising at least one of $NF_3$, $GeH_4$, HF, and $H_2$;

after the step of cleaning, rapid thermal nitridizing followed by depositing nitride to form a first dielectric layer on the silicon substrate;

depositing a semiconductor layer on the first dielectric layer;

rapid thermal nitridizing to convert at least a portion of the semiconductor layer to a second dielectric layer; and rapid thermal oxidizing the second dielectric layer.

2. A method, as in claim 1, wherein the step of depositing the semiconductor layer and the step of depositing the nitride are done with a process comprising at least one of molecular beam epitaxial, chemical vapor deposition, low pressure chemical vapor deposition, and rapid thermal process chemical vapor deposition.

3. A method for fabricating multi-layer dielectrics, the method comprising the steps of:

cleaning of a silicon substrate with vapor phase hydrogen halide at a temperature which is as low as 20° C. to remove native oxide from the silicon substrate;

after the step of cleaning, rapid thermal nitridizing followed by depositing nitride to form a first dielectric layer on the silicon substrate;

depositing a semiconductor layer on the first dielectric layer;

rapid thermal nitridizing to convert at least a portion of the semiconductor layer to a second dielectric layer; and rapid thermal oxidizing the second dielectric layer.

4. A method, as in claim 3, wherein the step of depositing the semiconductor layer and the step of depositing the nitride are done with a process comprising at least one of molecular beam epitaxial, chemical vapor deposition, low pressure chemical vapor deposition, and rapid thermal process chemical vapor deposition.

* * * * *